United States Patent
Huang et al.

(10) Patent No.: US 11,828,820 B2
(45) Date of Patent: Nov. 28, 2023

(54) HIGH-TEMPERATURE THREE-DIMENSIONAL HALL SENSOR WITH REAL-TIME WORKING TEMPERATURE MONITORING FUNCTION AND MANUFACTURING METHOD THEREFOR

(71) Applicant: DALIAN UNIVERSITY OF TECHNOLOGY, Dalian (CN)

(72) Inventors: Huolin Huang, Dalian (CN); Hui Zhang, Dalian (CN)

(73) Assignee: DALIAN UNIVERSITY OF TECHNOLOGY, Dalian (CN)

( * ) Notice: Subject to any disclaimer, the term of this patent is extended or adjusted under 35 U.S.C. 154(b) by 0 days.

(21) Appl. No.: 17/780,787

(22) PCT Filed: Dec. 3, 2019

(86) PCT No.: PCT/CN2019/122543
§ 371 (c)(1),
(2) Date: May 27, 2022

(87) PCT Pub. No.: WO2021/103052
PCT Pub. Date: Jun. 3, 2021

(65) Prior Publication Data
US 2022/0413068 A1    Dec. 29, 2022

(30) Foreign Application Priority Data
Nov. 29, 2019  (CN) .......................... 201911201576.3

(51) Int. Cl.
*G01R 33/07*    (2006.01)
*G01R 33/02*    (2006.01)
(Continued)

(52) U.S. Cl.
CPC ....... *G01R 33/072* (2013.01); *G01R 33/0206* (2013.01); *G01R 33/077* (2013.01);
(Continued)

(58) Field of Classification Search
CPC .............. G01R 33/072; G01R 33/0206; G01R 33/077; H10B 61/20; H10N 52/01; H10N 52/101; H10N 59/00
See application file for complete search history.

(56) References Cited

U.S. PATENT DOCUMENTS

2019/0097126 A1*  3/2019  Tan ...................... H10N 52/101

FOREIGN PATENT DOCUMENTS

| CN | 107966669 A | 4/2018 |
|---|---|---|
| CN | 108538866 A | 9/2018 |
| CN | 108649117 A | 10/2018 |

OTHER PUBLICATIONS

First Office Action issued in corresponding Chinese Patent Application No. 201911201576.3, dated Mar. 1, 2021, 15 pgs.
(Continued)

*Primary Examiner* — Matthew L Reames
(74) *Attorney, Agent, or Firm* — HAUPTMAN HAM, LLP

(57) ABSTRACT

A high-temperature three-dimensional Hall sensor with a real-time working temperature monitoring function includes a buffer layer, an epitaxial layer, and a barrier layer sequentially grown on a substrate. A high-density two-dimensional electron gas is induced by polarization charges in a potential well at an interface of heterojunctions of the epitaxial layer. A lower surface of the substrate includes a vertical Hall sensor for sensing a magnetic field parallel to a surface of a device. An upper surface of the barrier layer includes a "cross" horizontal Hall sensor for sensing a magnetic field perpendicular to the surface of the device.

7 Claims, 7 Drawing Sheets

(51) Int. Cl.
*H10B 61/00* (2023.01)
*H10N 52/01* (2023.01)
*H10N 52/80* (2023.01)
*H10N 52/00* (2023.01)

(52) U.S. Cl.
CPC ............ *H10B 61/20* (2023.02); *H10N 52/01* (2023.02); *H10N 52/101* (2023.02); *H10N 52/80* (2023.02)

(56) References Cited

OTHER PUBLICATIONS

Notification to Grant Patent Right for Invention issued in corresponding Chinese Patent Application No. 201911201576.3, dated Sep. 18, 2021, 3 pgs.
Dowling, Karen M., et al.; "Micro-Tesla Offset in Thermally Stable AlGaN/GaN 2DEG Hall Plates Using Current Spinning"; IEEE Sensors Letters, vol. 3, No. 3, Mar. 2019 (publication date Feb. 7, 2019); 4 pgs.
Cao, Ya-Qing, et al.; "Demonstration of wide bandgap GaN-based heterojunction vertical Hall sensors for high-temperature magnetic field detection"; Acta Physica Sinica, vol. 68, No. 15, 2019; 11 pgs. (English Abstract).

* cited by examiner

HIGH-TEMPERATURE THREE-DIMENSIONAL HALL SENSOR WITH REAL-TIME WORKING TEMPERATURE MONITORING FUNCTION AND MANUFACTURING METHOD THEREFOR

RELATED APPLICATIONS

The present application is a U.S. National Phase of International Application Number PCT/CN2019/122543, filed Dec. 3, 2019, and claims priority to Chinese Application Number 201911201576.3, filed Nov. 29, 2019.

TECHNICAL FIELD

The present invention relates to the field of semiconductor sensors, and in particular, to the high-temperature three-dimensional Hall sensor with the real-time working temperature monitoring function and the manufacturing method therefor.

BACKGROUND

Magnetic sensors can convert magnetic field signals into electrical signals that can be detected. Magnetic sensors have important applications in the fields such as automation, medical systems, and data communications. Hall sensors based on the principle of the Hall effect are the important representative of magnetic sensors and have the most extensive applications. Conventional Hall sensors are mainly made of narrow band-gap semiconductor materials such as silicon (Si), gallium arsenide (GaAs), indium arsenide (InAs), and indium antimonide (InSb), and can work in the environment below 125° C. However, due to the small band-gap of these materials, when the magnetic sensors work in the high-temperature environment more than 125° C., the mechanisms such as impurity scattering and lattice scattering inside the materials seriously affect the carrier mobility, so that the detection sensitivity of the magnetic sensors is seriously attenuated and the magnetic sensors cannot work normally. At present, the market still needs magnetic sensor products that can work stably in the environment from room temperature to higher than 400° C. For example, magnetic sensors perform local measurement of the Curie temperature of the circuitry and ferromagnetic materials in space exploration vehicles, etc. In order to detect the magnetic field in any direction in space, the existing three-dimensional Hall sensor is obtained by integrating three one-dimensional Hall sensors that measure the magnetic field in the single direction. The Hall sensor has the large size and complicated wiring. Thus, new applications in some miniature Hall sensors are limited. For example, the Hall sensor performs detection of magnetic tags attached to target molecules in medical diagnosis, etc. At present, although there have been some reports of gallium nitride (GaN) heterojunction-based Hall sensors suitable for the high-temperature working environment, the Hall sensors generally can only measure the one-dimensional longitudinal magnetic field perpendicular to the surface of the sensor, and can only achieve the magnetic field measurement function, and cannot monitor the environment and the working temperature of the sensor device in real time at the same time.

Compared with conventional materials such as Si and GaAs, the third-generation semiconductor materials represented by silicon carbide (SiC) and GaN have the characteristics of large band gap, high critical breakdown electric field, and high saturated electron drift velocity, and has good material advantages and broad application prospects in the preparation of high-temperature Hall sensors. On the one hand, compared with the Si material, the SiC material has the wide band gap (about 3.25 eV) and high thermal conductivity (3~5 W/(cm K)). When the Hall sensor made therefrom works, since there is no internal longitudinal electric field, electrons will not be bound in the transverse current channel during the longitudinal offset process. Therefore, the SiC material is suitable for making the vertical Hall sensor that detects the magnetic field in the horizontal direction. On the other hand, there is the high-density two-dimensional electron gas (2 DEG) induced by polarization charges in the potential well at the interface of GaN material heterojunctions (typically such as AlGaN/GaN, AlN/GaN, and InAlN/GaN), and high electron mobility can be maintained in the channel without intentional doping (the typical value is 2000 cm2/V·s). Therefore, the GaN-based material is suitable for making the horizontal Hall sensor for detecting the longitudinal magnetic field.

There are two main types of existing Hall sensors, one is the Hall sensor made of the single material represented by Si, and the other is the Hall sensor based on the heterojunction structure. The Hall sensor made of the silicon-based material is easy to mass-produce because it is compatible with the integrated circuit technique. Most of the relatively mature products on the market are made of the Si material. There is the high-density two-dimensional electron gas with high mobility induced by polarization charges at the interface of heterojunctions such as InAs and InSb, and Hall sensors made of these heterojunction materials can obtain high sensitivity. However, these conventional materials have the narrow band gap, and the mechanisms such as impurity scattering and lattice scattering inside the materials in the environment above 125° C. seriously affect the carrier mobility, so that the detection sensitivity of the magnetic sensors is seriously attenuated and the magnetic sensors cannot work normally. Therefore, the use of Hall sensors in the high-temperature environment is limited.

At present, there are mainly horizontal Hall sensors and vertical Hall sensors that measure the single magnetic field on the market. In order to detect the magnetic field in any direction in space, the three-dimensional Hall sensor that integrates the horizontal Hall sensor (to measure the magnetic field in the Z direction) and the vertical Hall sensor (to measure the horizontal magnetic field in the X or Y direction) in the same plane has been designed. Due to the integration of two types of Hall sensors, the final three-dimensional Hall sensor device is has the large size and complicated wiring. In addition, the three-dimensional Hall sensor can also be obtained by integrating three Hall sensors that measure the magnetic field in the single direction in the X, Y, and Z directions. For example, the TLV493D three-dimensional Hall sensor, which is relatively mature in the market, can measure the magnetic field in any direction in space by rotating the vertical Hall sensor in the X, Y, and Z directions. Its disadvantages are also that it has the large size and low spatial resolution and can only work in the environment below 125° C.

There have been some reports on high-temperature Hall sensors, such as GaN heterojunction-based horizontal Hall sensors. The large band gap of the GaN material enables the Hall sensor made therefrom to work stably in the high-temperature environment, but the Hall sensor generally can only measure the one-dimensional longitudinal magnetic field perpendicular to the surface of the sensor, and can only achieve the magnetic field measurement function, and cannot monitor the environment and the working temperature of the sensor device in real time at the same time.

The Hall sensor made of the conventional semiconductor material can only work stably at low temperature or room temperature. The mechanisms such as impurity scattering and lattice scattering inside the material seriously affect the carrier mobility in the environment higher than 125° C., resulting in that the sensor cannot working normally. The large size of the integrated three-dimensional Hall sensor designed to detect the magnetic field in any direction in space limits its application in micro and nano small-sized Hall sensors. There is the high-density two-dimensional electron gas induced by polarization charges in the potential well at the interface of GaN heterojunctions, and there is the longitudinal electric field in the direction of the vertical channel, which reduces the sensitivity of the vertical Hall sensor. Although there have been some reports on GaN heterojunction-based high-temperature horizontal Hall sensors, these sensors can only achieve the magnetic field measurement function, and cannot achieve real-time monitoring of the working temperature at the same time.

SUMMARY

In order to solve the above problems in the prior art, the present invention provides the high-temperature three-dimensional Hall sensor with the real-time working temperature monitoring function and the manufacturing method therefor. The three-dimensional Hall sensor can work stably at high temperature and measure the magnetic field in any direction in space, has the small size, has large sensitivity, and also has the temperature measurement function, and can perform accurate magnetic field measurement and real-time working temperature monitoring without affecting the normal working of the sensor.

The technical solution is as follows:

The high-temperature three-dimensional Hall sensor with the real-time working temperature monitoring function, including: the substrate, the buffer layer, the epitaxial layer, and the barrier layer, where the buffer layer, the epitaxial layer, and the barrier layer are sequentially grown on the substrate, and there is the high-density two-dimensional electron gas induced by polarization charges in the potential well at the interface of heterojunctions of the epitaxial layer; the lower surface of the substrate is provided with the vertical Hall sensor for sensing the magnetic field parallel to the surface of the device, and the upper surface of the barrier layer is provided with the "cross" horizontal Hall sensor for sensing the magnetic field perpendicular to the surface of the device; the vertical Hall sensor is in the shape of the "cross" as the whole, the common terminal electrode C2, the sensing electrode S2, the signal input terminal C0, the sensing electrode S1, and the common terminal electrode C1 are sequentially arranged in the transverse direction of the "cross", the common terminal electrode C1', the sensing electrode S1', the signal input terminal C0, the sensing electrode S2', and the common terminal electrode C2' are sequentially arranged in the longitudinal direction of the "cross", and the junction of the transverse and longitudinal directions of the "cross" is the signal input terminal C0; four ends of the "cross" of the "cross" horizontal Hall sensor are respectively provided with the signal input electrode C3, the signal input electrode C4, the sensing electrode S3, and the sensing electrode S4, the signal input electrode C3 is arranged opposite to the signal input electrode C4, and the sensing electrode S3 is arranged opposite to the sensing electrode S4; and the signal input electrode C3 and the signal input electrode C4 extend from the barrier layer to the epitaxial layer and are in contact with the epitaxial layer.

Further, the substrate is SiC, the buffer layer is any one of AlN, GaN, and the superlattice structure, the epitaxial layer is GaN, and the barrier layer is AlGaN, AlN, InAlN or any combination thereof.

Further, the buffer layer has the thickness of 10 nm to 100 nm, the epitaxial layer has the thickness of 0.1 μm to 50 μm, and the barrier layer has the thickness of 3 nm to 100 nm.

Further, the common terminal electrode C2, the sensing electrode S2, the signal input terminal C0, the sensing electrode S1, the common terminal electrode C1, the common terminal electrode C1', the sensing electrode S1', the sensing electrode S2', the common terminal electrode C2', the signal input electrode C3, the signal input electrode C4, the sensing electrode S3, and the sensing electrode S4 are rectangular, trapezoidal, or circular.

Further, the common terminal electrode C1 and the common terminal electrode C2 are centrally symmetric with respect to the signal input terminal C0, and the sensing electrode S1 and the sensing electrode S2 are centrally symmetric with respect to the signal input terminal C0.

Further, the cross section of the edge of the substrate is the step, and the common terminal electrode C1 and the common terminal electrode C2 extend from the lower surface of the substrate to the step.

The present invention further provides the method for manufacturing the high-temperature three-dimensional Hall sensor with the real-time working temperature monitoring function, including the following steps:

S1: cleaning the substrate material to remove contaminants on the surface of the substrate;

S2: epitaxially growing the buffer layer, the epitaxial layer, and the barrier layer by using any one of the metal organic compound chemical vapor deposition method, the molecular beam epitaxy method, and the hydride vapor phase epitaxy method;

S3: after the epitaxially grown sample is subjected to photolithography and development, mesa etching by using the inductively coupled plasma etching method;

S4, after photolithography and development, depositing composite metal by using the electron beam evaporation system, and then forming ohmic contact by using the rapid thermal annealing process;

S5, depositing the dielectric layer for device passivation by using any one of the plasma-enhanced chemical vapor deposition method, the magnetron sputtering method, the atomic layer deposition method, and the electron beam evaporation method; and S6, photographing and corroding the passivation layer at the electrode to form the window, and using any one of the magnetron sputtering method, the electron beam evaporation method, and the thermal evaporation method to deposit metal at the electrode to make the pad and make the lead.

Further, the substrate is SiC, the buffer layer is any one of AlN, GaN, and the superlattice structure, the epitaxial layer is GaN, and the barrier layer is AlGaN, AlN, InAlN or any combination thereof.

Further, the buffer layer has the thickness of 10 nm to 100 nm, the epitaxial layer has the thickness of 0.1 μm to 50 μm, and the barrier layer has the thickness of 3 nm to 100 nm.

Further, in step S3, the mesa etching depth is 50 nm to 800 nm.

The beneficial effects of the present invention are:

The high-temperature three-dimensional Hall sensor with the real-time working temperature monitoring function according to the present invention mainly has four technical advantages: 1) SiC and GaN materials have the large band gap and are high-quality materials for preparing high-temperature Hall sensors, and vertical and horizontal Hall sensors prepared therefrom work stably at high temperature (above 400° C.). 2) When the GaN heterojunction structure is epitaxially grown on the SiC substrate material, there is the low lattice mismatch. Compared with commonly used substrate materials, Si and sapphire, the lattice mismatch between SiC and GaN is much smaller (the typical value is 3.5% to 3.8%), and thermal conductivity is also much higher than that of the sapphire substrate (the typical value is 4.9 W/(cm K)). Therefore, the SiC material should be used to make the substrate. 3) The substrate made of the SiC material is used to make the vertical Hall sensor for measuring the horizontal magnetic field. Compared with the GaN heterojunction, there is no longitudinal electric field perpendicular to the direction of the channel for SiC as the bulk material, and electrons in the channel are less bound, which is beneficial to improve the sensitivity of the vertical device. The GaN heterojunction is used to make the horizontal Hall sensor that measures the magnetic field in the vertical direction. There is the high-density two-dimensional electron gas induced by polarization charges in the potential well at the interface of heterojunctions, and the gas has high mobility. Therefore, the sensor has high sensitivity. 4) The added temperature measurement structure will not affect the original sensor structure, and accurate magnetic field measurement and real-time working temperature monitoring can be performed at the same time without affecting normal working of the sensor.

In the beneficial effects brought by the technical solution of the present invention, on the one hand, compared with conventional semiconductor materials, the characteristic of large band gap of SiC and GaN materials is utilized, which can satisfy use of Hall sensors in the high-temperature environment. On the other hand, provided is the new three-dimensional Hall sensor structure, which is the high-temperature three-dimensional Hall sensor that can achieve real-time working temperature monitoring and integrates the vertical Hall sensor on the SiC back surface and the horizontal Hall sensor on the GaN heterojunction-based front surface. There is the small lattice mismatch between the epitaxially grown GaN heterojunction and the SiC substrate. The vertical Hall sensor made of the SiC material has improved sensor sensitivity because there is no longitudinal electric field. The GaN heterojunction-based horizontal Hall sensor also improves device sensitivity due to the characteristic of high electron mobility. Finally, the temperature measurement structure is added, which neither affects the original sensor structure nor affects normal working of the sensor, and accurate magnetic field measurement and real-time working temperature monitoring can be performed at the same time. The high-temperature three-dimensional Hall sensor that can perform temperature measurement manufactured in the present solution is expected to be widely used in various military, aerospace, medical, micro and nano sensors in the future.

DETAILED DESCRIPTION

The high-temperature three-dimensional Hall sensor with the real-time working temperature monitoring function and the manufacturing method therefor will be further described below with reference to FIGS. 1-9.

EXAMPLE 1

Figure 1:
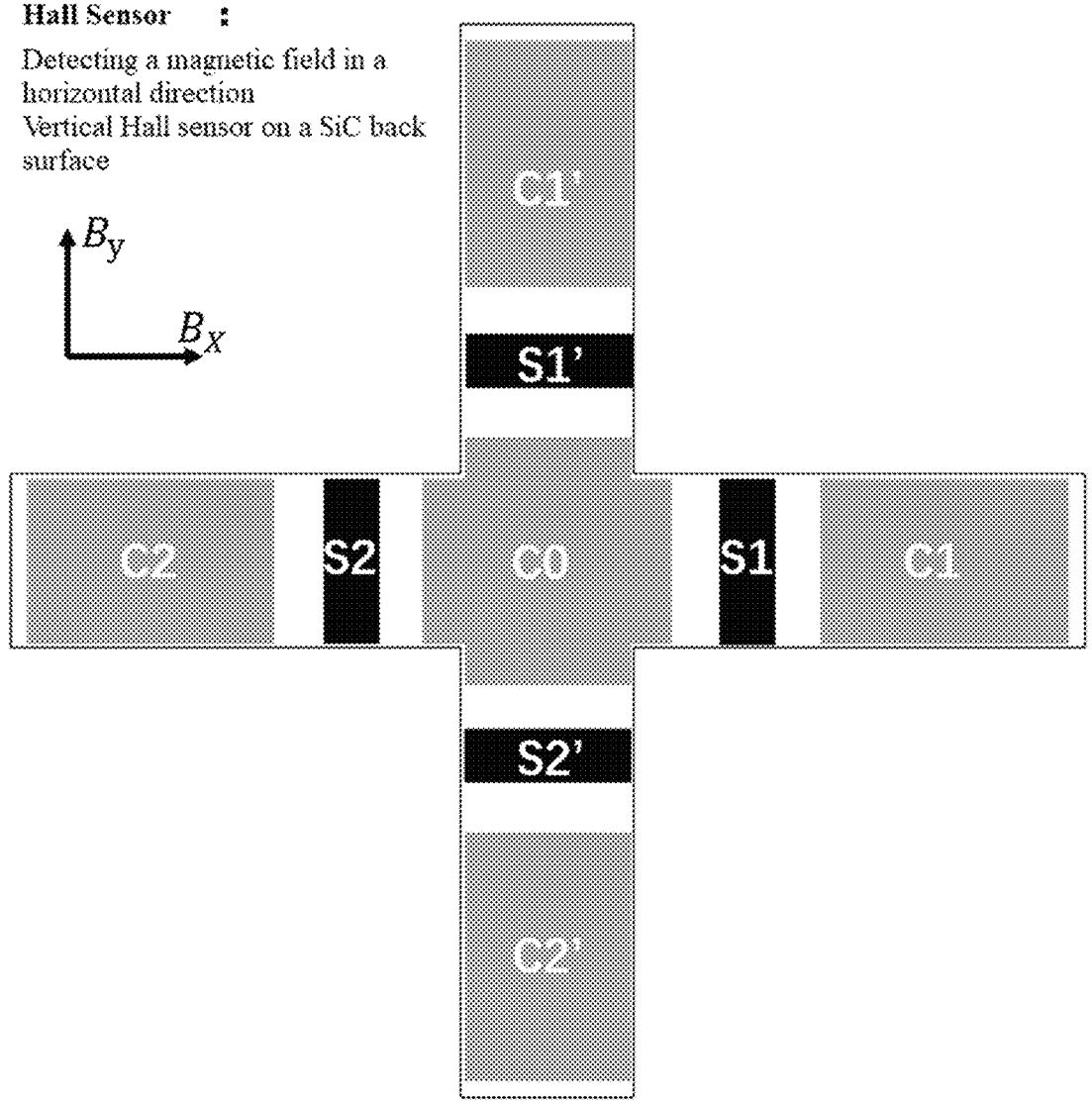
FIG. 1 is the schematic diagram of the structure of the vertical Hall sensor on the SiC back surface of the high-temperature three-dimensional Hall sensor with the real-time working temperature monitoring function provided by the application of the present invention.

The application of the present invention provides the high-temperature three-dimensional Hall sensor that can achieve real-time working temperature monitoring and integrates the vertical Hall sensor on the SiC back surface and the horizontal Hall sensor on the GaN heterojunction-based front surface. FIG. 1 is the schematic structural diagram of the back surface of the device structure. The substrate made of the SiC material is used to make the vertical Hall sensor for sensing the magnetic field By and Bx parallel to the surface of the device. The electrode C0 is the signal input terminal to which the current or the voltage is input, and electrodes C1, C2 and C1', C2' are grounded as common terminals. If there is the magnetic field By parallel to the y direction, currents of the electrodes C0→C1 and C0→C2 are perpendicular to the direction of the magnetic field, moving carriers are deflected under the effect of the Lorentz force, and the potential difference is felt on both sides of electrodes S1 and S2, i.e., the Hall voltage, to achieve the purpose of measuring the magnetic field. In the same way, if there is the magnetic field Bx parallel to the x direction, currents of the electrodes C0→C1' and C0→C2' are perpendicular to the direction of the magnetic field, and the potential difference is felt on both sides of the electrodes S1' and S2', so that the magnitude of the magnetic field in the x direction can be measured. The electrode C0 can also be grounded, the current or the voltage is input to the electrodes C1, C2 and C1', C2', and the potential difference is measured at S1, S2 and S1', S2'. There is no longitudinal electric field for the SiC material, which improves the sensitivity of the vertical Hall sensor. The SiC material has the large band gap, and the Hall sensor made therefrom can work stably at high temperature.

Figure 2:
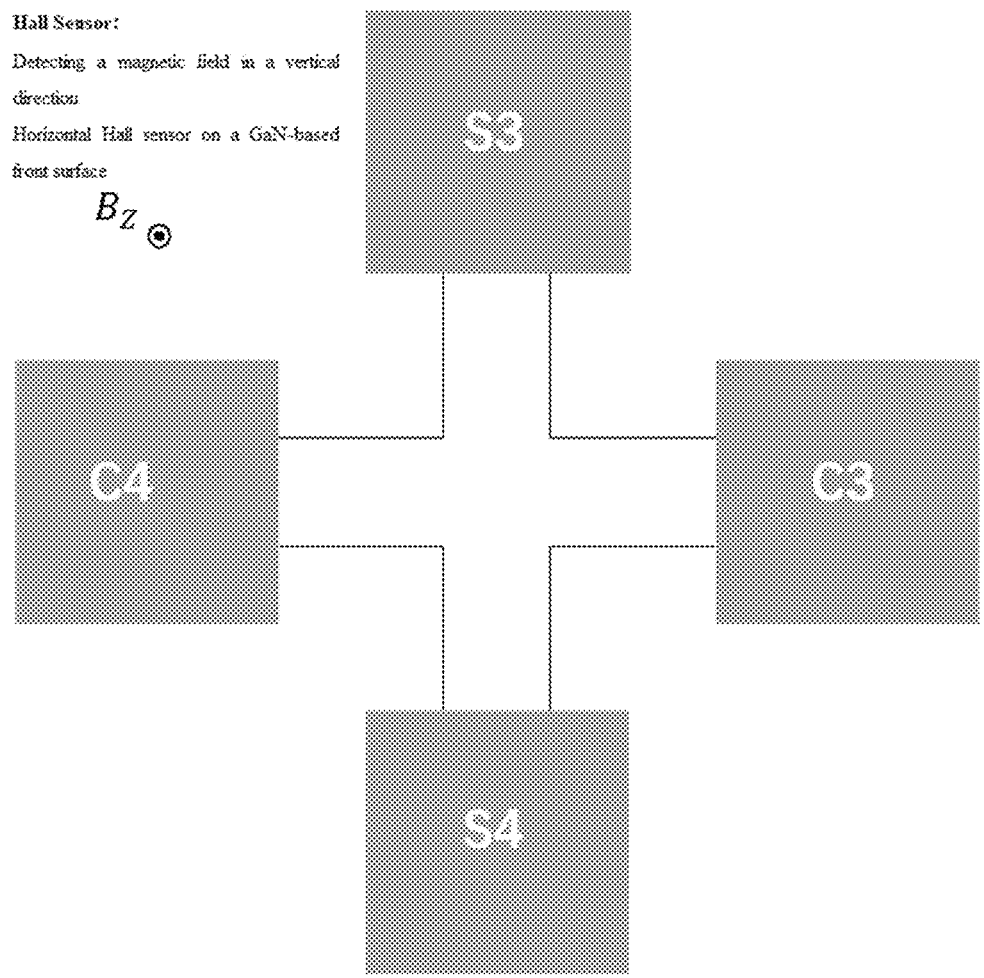
FIG. 2 is the schematic diagram of the structure of the horizontal Hall sensor on the GaN-based front surface of the high-temperature three-dimensional Hall sensor with the real-time working temperature monitoring function provided by the application of the present invention.

FIG. 2 is the schematic structural diagram of the front of the device structure. The GaN heterojunction structure is used to make the cross horizontal Hall sensor for sensing the magnetic field Bz perpendicular to the surface of the device. Electrodes C3 and C4 are signal input terminals to which the current or the voltage can be input, and the potential difference is measured between electrodes S3 and S4. The electrodes S3 and S4 can also be used as signal input terminals to which the current or the voltage is input, and the potential difference is measured between the electrodes C3 and C4. During magnetic field measurement, the current or the voltage is input to C3, C4 or S3, S4 terminals, and the voltage or the current at C3, C4 or S3, S4 terminals is measured through the voltmeter or ammeter, so that the two-dimensional electron gas resistance can be obtained, and the purpose of measuring the temperature is achieved through the relationship between the two-dimensional electron gas resistance and the temperature. The GaN heterojunction structure effectively expands the stable working temperature range of the sensor and increases the sensitivity of the sensor. The added temperature measurement does not change the original device structure, and accurate magnetic field measurement and real-time working temperature monitoring can be performed at the same time without affecting normal working of the sensor.

Figure 3:
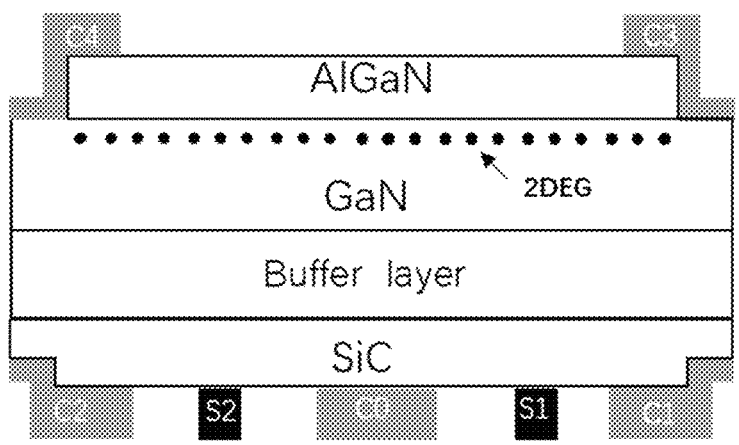
FIG. 3 is the schematic diagram of the cross-section of the high-temperature three-dimensional Hall sensor with the real-time working temperature monitoring function provided by the application of the present invention.
Figure 4:
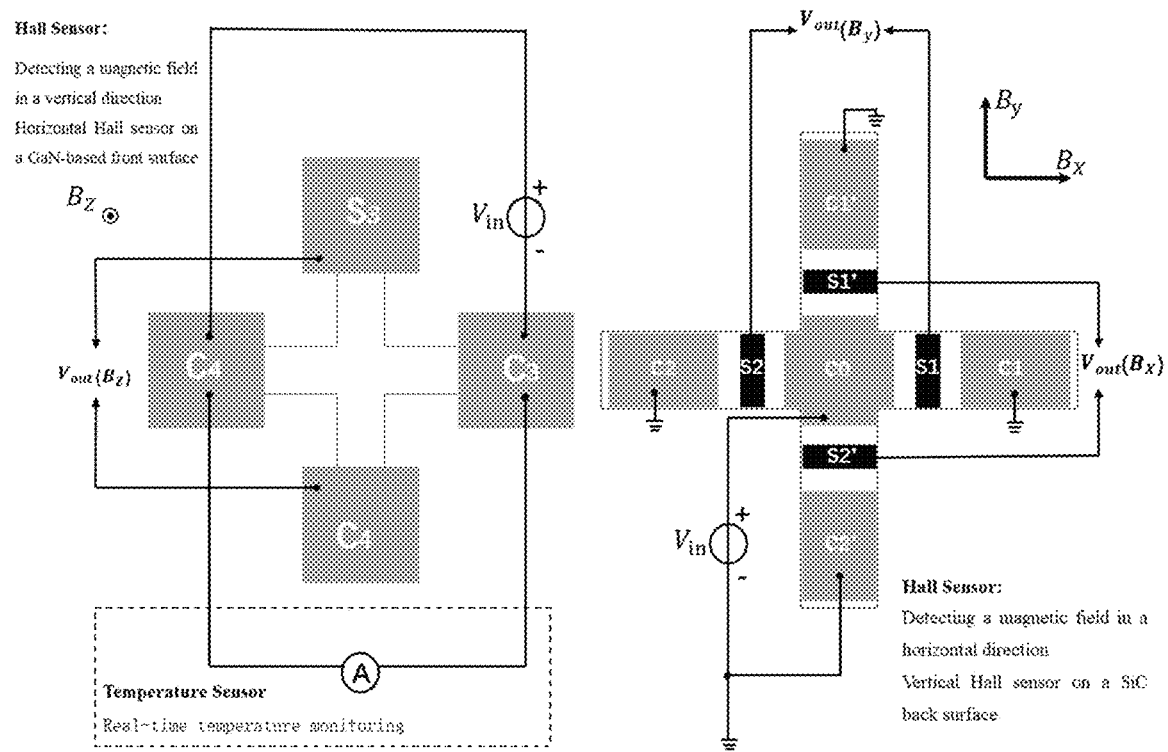
FIG. 4 is the working principle diagram of the high-temperature three-dimensional Hall sensor with the real-time working temperature monitoring function provided by the application of the present invention.
Figure 5:
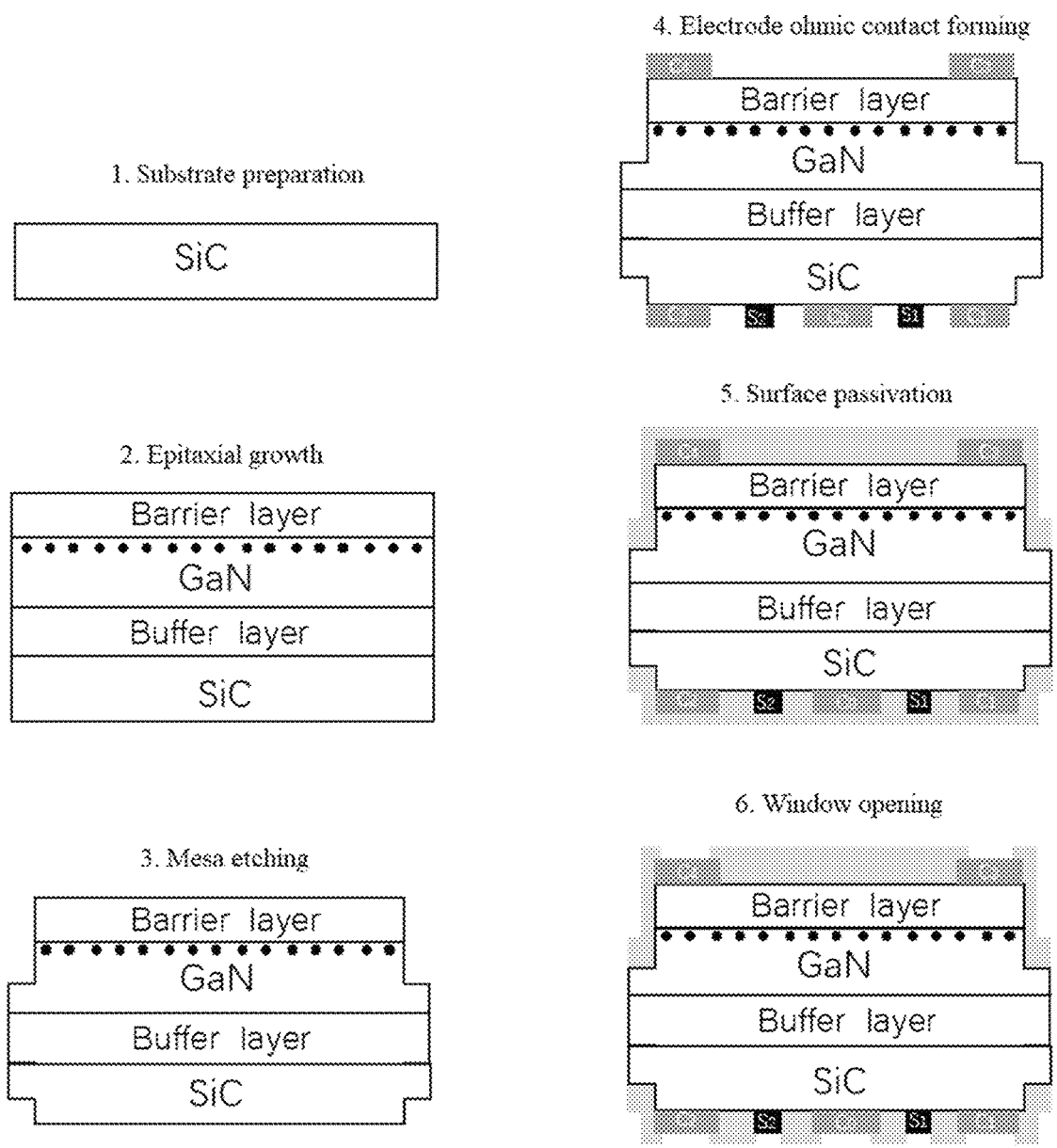
FIG. 5 is the process flow diagram of the specific example of the application of the present invention.

The schematic structural diagram of the technical solution of the application of the present invention is as shown in FIG. 3. FIG. 3 is the schematic cross-sectional diagram of the sensor. The substrate is made of the surface-polished SiC material on which the buffer layer and the GaN heterojunction structure are epitaxially grown, where the buffer layer may be made of AlN or GaN (having the thickness of 10-100 nm). The epitaxial layer is made of GaN (having thickness of 0.1-50 μm), and the barrier layer (3-100 nm) is provided on the epitaxial layer. The barrier layer may be made of AlGaN, AlN, InAlN, or any combination thereof, and the material composition in the barrier layer is not limited. Electrodes C1 and C2 are centrally symmetric with respect to C0, sensing electrodes S1 and S2 are centrally symmetric with respect to C0, and electrodes C3 and C4 are symmetric. The shape of the electrode is not limited, and may be rectangular, trapezoidal, etc. The electrode and the semiconductor material need to form the good ohmic contact. FIG. 4 is the working principle diagram of the three-dimensional Hall sensor.

It should be noted that the GaN heterojunction material in the example of the present invention may be the semiconductor heterojunction material that can generate the 2 DEG, such as AlGaN/GaN, AlN/GaN, and InAlN/GaN; the material of the barrier layer on the GaN surface may be AlGaN, and can also be AlN, InAlN, or the combination thereof; and the buffer layer may be made of AlN, GaN, or the superlattice structure.

The technical key point of the present invention lies in the innovation of the three-dimensional Hall sensor structure, which transforms the three-dimensional Hall sensor that integrates conventional Hall sensors that measure the magnetic field in the single direction into the high-temperature three-dimensional Hall sensor that can achieve real-time working temperature monitoring and integrates the vertical Hall sensor on the SiC back surface and the horizontal Hall sensor on the GaN heterojunction-based front surface. While ensuring detection of magnetic field in the X, Y, and Z three-dimensional direction, the solution of the present invention greatly reduces the size of the three-dimensional Hall sensor chip, simplifies wiring, improves the detection sensitivity of the three-dimensional magnetic field, and can also work in the high-temperature environment. The added temperature measurement structure will not affect the original sensor structure, and accurate magnetic field measurement and real-time working temperature monitoring can be performed at the same time without affecting normal working of the sensor. The application of the present invention mainly claims the provided device structure design and the corresponding device manufacturing method.

The technical solution of the present invention provides the high-temperature three-dimensional Hall sensor that can achieve real-time working temperature monitoring and integrates the vertical Hall sensor on the SiC back surface and the horizontal Hall sensor on the GaN heterojunction-based front surface. The advantages of the device are: 1) SiC and GaN materials have the large band gap and are high-quality materials for preparing high-temperature Hall sensors, vertical and horizontal Hall sensors prepared therefrom can work stably at high temperature (above 400° C.). 2) When the GaN heterojunction structure is epitaxially grown on the SiC substrate material, there is the low lattice mismatch. Compared with commonly used substrate materials, Si and sapphire, the lattice mismatch between SiC and GaN is much smaller (the typical value is 3.5%~3.8%), and thermal conductivity is also much higher than that of the sapphire substrate (the typical value is 4.9 W/(cm K)). 3) The substrate made of the SiC material is used to make the vertical Hall sensor for measuring the horizontal magnetic field. Compared with the GaN heterojunction, there is no longitudinal electric field perpendicular to the direction of the channel for SiC as the bulk material, and electrons in the channel are less bound, which is beneficial to improve the sensitivity of the vertical Hall Sensor. The GaN heterojunction is used to make the horizontal Hall sensor that measures the magnetic field in the vertical direction. High mobility is achieved. Therefore, the sensor has high sensitivity. 4) The added temperature measurement structure will not affect the original sensor structure, and accurate magnetic field measurement and real-time working temperature monitoring can be performed at the same time without affecting normal working of the sensor.

The implementation process of the target device of the application of the invention is described as follows.

1) Substrate preparation: the substrate made of the SiC material is prepared, the substrate material is cleaned, and contaminants on the surface of the SiC substrate are removed.

2) Epitaxial growth: the buffer layer and the GaN heterojunction structure are epitaxially grown by using any one of metal organic compound chemical vapor deposition (MOCVD), Molecular Beam Epitaxy (MBE), and Hydride Vapor Phase Epitaxy (HVPE). The buffer layer may be made of AlN, GaN, or the superlattice structure and has the thickness of 10-100 nm. The generated GaN epitaxial layer has the thickness of 0.1-50 μm, the barrier layer on the epitaxial layer has the thickness of 3-100 nm, and the barrier layer may be made of AlGaN, AlN, InAlN, or the combination thereof.

3) Mesa etching: the epitaxially grown sample is subjected to photolithography and development, and is then etched by using the Inductively Coupled Plasma (ICP) etching, and the mesa etching depth is 50-800 nm.

4) Electrode ohmic contact forming: after photolithography and development, composite metal is deposited by using the Electron Beam (EB) evaporation system, and then the good ohmic contact is formed by using the Rapid Thermal Annealing (RTA) process.

5) Surface passivation: the dielectric layer for device passivation is deposited by using any one of Plasma-Enhanced Chemical Vapor Deposition (PECVD), magnetron sputtering, Atomic Layer Deposition (ALD), and EB evaporation.

6) Window opening: the passivation layer is photographed and corroded at the electrode to form the window, and using any one of magnetron sputtering, EB evaporation, and thermal evaporation to deposit metal at the electrode to make the pad, and make the lead.

EXAMPLE 2

The manufacturing process of the specific example of the target device of the invention of the present invention is described as follows:

1) Substrate preparation: the substrate made of the SiC material is prepared, and the substrate material is cleaned in sequence by using acetone, ethanol, and deionized water to remove contaminants on the surface of the SiC substrate.

2) Epitaxial growth: the AlGaN/GaN heterojunction structure is epitaxially grown by using MOCVD equipment. The buffer layer is made of AlN and has the thickness of 45 nm; the generated GaN epitaxial layer is unintentionally doped and has the thickness of 5 μm, and the background electron concentration is less than $3.5 \times 10^{16}$ cm−3; the AlGaN barrier layer on the epitaxial layer has the thickness of 30 nm, and the component Al accounts for 0.25.

3) Mesa etching: the epitaxially grown sample is coated (using the AZ6130 positive photoresist) and spin-coated (forward rotating at 600 rpm for 3 s and reversely rotating at 1500 rmp 20 s, the final thickness of the photoresist being 1.5 um), then exposed for 80 s and developed for 75 seconds, and step-hardbaked at 90-150° C. for 30 minutes. The heterojunction and the SiC substrate are etched by using ICP equipment at the power of 200 W, 200 sccm of the Cl-based gas is introduced for etching for 150 s, and finally the etching depth of about 400 nm is formed.

4) Electrode ohmic contact forming: first, the back electrode is manufactured. After photolithography development, three layers of metal, i.e., Ni(80 nm)/Ti(30 nm)/Al(80 nm), are deposited on the surface of the SiC back surface by using the Electron Beam (EB) evaporation system, and then annealing is performed in the nitrogen environment of 1000° C. for 5 min to form the ohmic contact. Second, front electrode fabrication. Four layers of metal, i.e., Ti(20 nm)/Al(100 nm)/Ni(45 nm)/Au(55 nm) are deposited on the surface of AlGaN/GaN by using the EB evaporation system, and annealing is performed in the nitrogen environment of 860° C. for 30 s by using RTA equipment to form the ohmic contact.

5) Surface passivation: the 200 nm-thick $SiO_2$ passivation layer is deposited at the temperature of 300° C. by using PECVD equipment to form the passivation protection on the surface of the chip.

6) Window opening: the passivation layer at the electrode is corroded and the window is opened for leading. The sample is coated (using the AZ6130 positive photoresist) and spin-coated (forward rotating at 600 rpm for 3 s and reversely rotating at 1500 rmp for 20 s, the final thickness of the photoresist being 1.5 um), exposed for 80 s, and developed for 75 seconds, and the electrode after surface passivation is etched to form the window; then, Au of 500 nm is deposited on the electrode by means of magnetron sputtering, and leading is performed to lead out the electrode.

Figure 6:
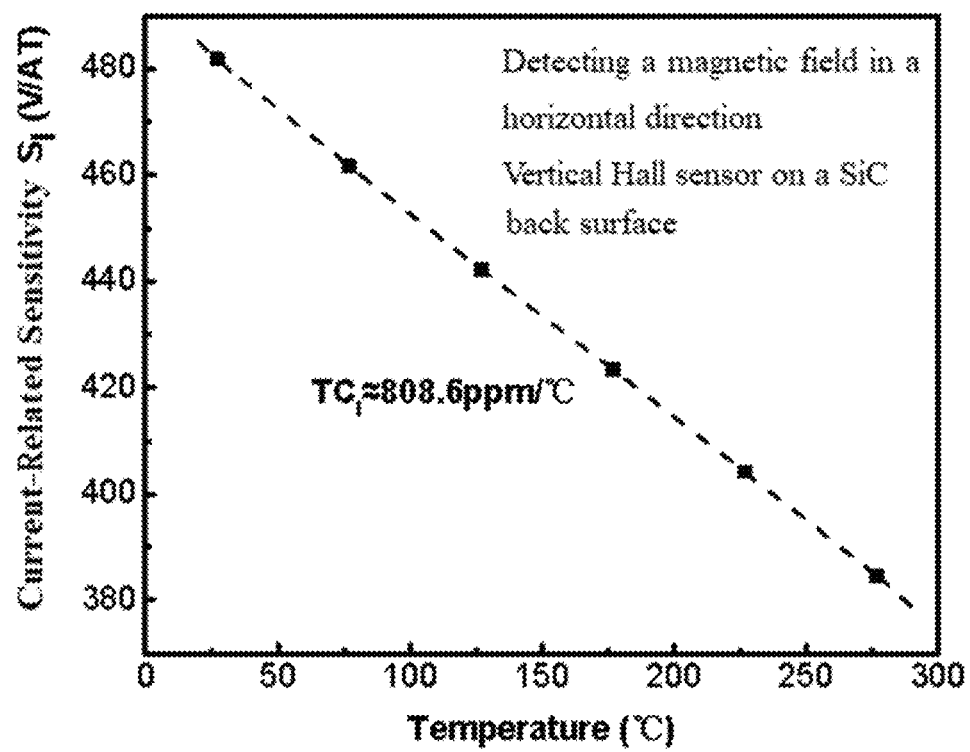
FIG. 6 is the experimental verification result diagram of the relationship between the current sensitivity and temperature of the vertical Hall sensor on SiC back surface in the high-temperature three-dimensional Hall sensor with the real-time working temperature monitoring function provided by the application of the present invention.
Figure 7:
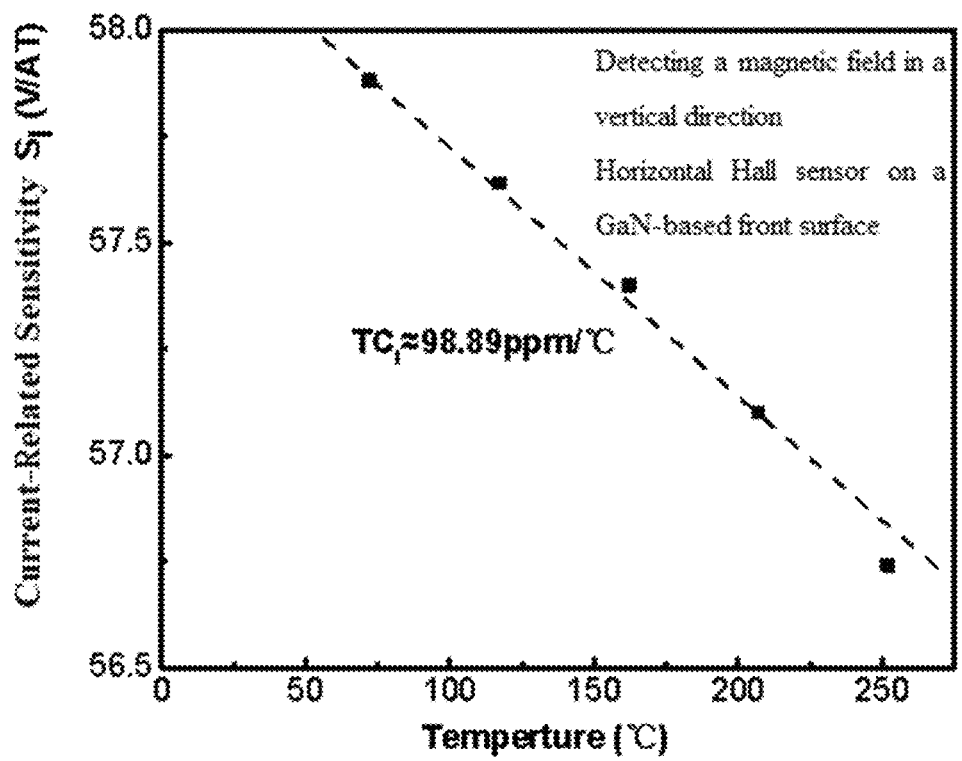
FIG. 7 is the experimental verification result diagram of the relationship between the current sensitivity and temperature of the horizontal Hall sensor on the GaN-based front surface in the high-temperature three-dimensional Hall sensor with the real-time working temperature monitoring function provided by the application of the present invention.

FIG. 6 and FIG. 7 show magnetic field measurement of the relationship between current-related sensitivity and temperature by the sensor designed by the application of the present invention. As can be seen from FIG. 6, although the sensitivity of the vertical Hall sensor using the SiC substrate material decreases with the increase of temperature, it still maintains high current sensitivity, and the temperature drift coefficient of its current-related sensitivity is about 808.6 ppm/° C. As shown in FIG. 7, although the current sensitivity of the GaN-based horizontal Hall sensor decreases with the increase of temperature, the decrease range is very small, and its temperature drift coefficient is about 98.89 ppm/° C. In combination with the results of FIG. 6 and FIG. 7, it can be confirmed that the Hall sensor obtained based on the example of the present invention can obtain high sensitivity and can work stably at high temperature at the same time.

Figure 8:
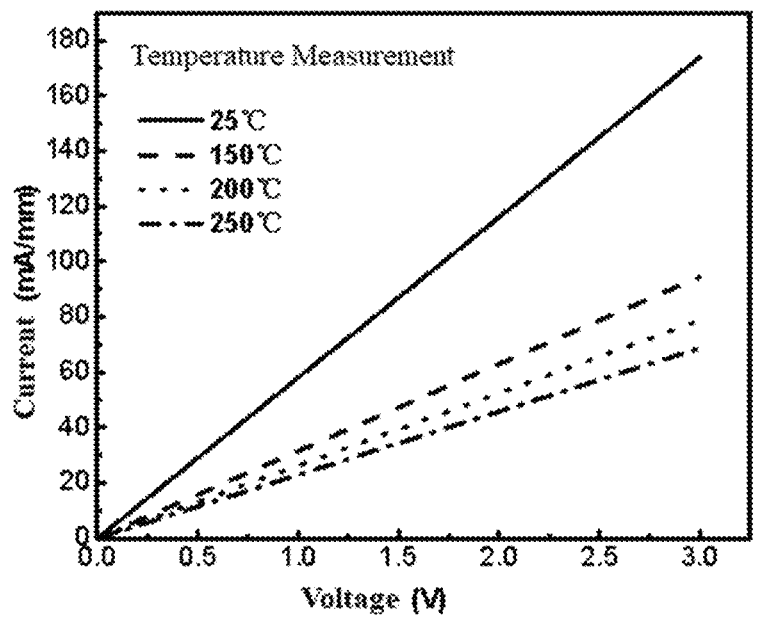
FIG. 8 is the experimental verification result diagram for temperature measurement of the relationship between partial voltage and the current by the high-temperature three-dimensional Hall sensor with the real-time working temperature monitoring function provided by the application of the present invention.
Figure 9:
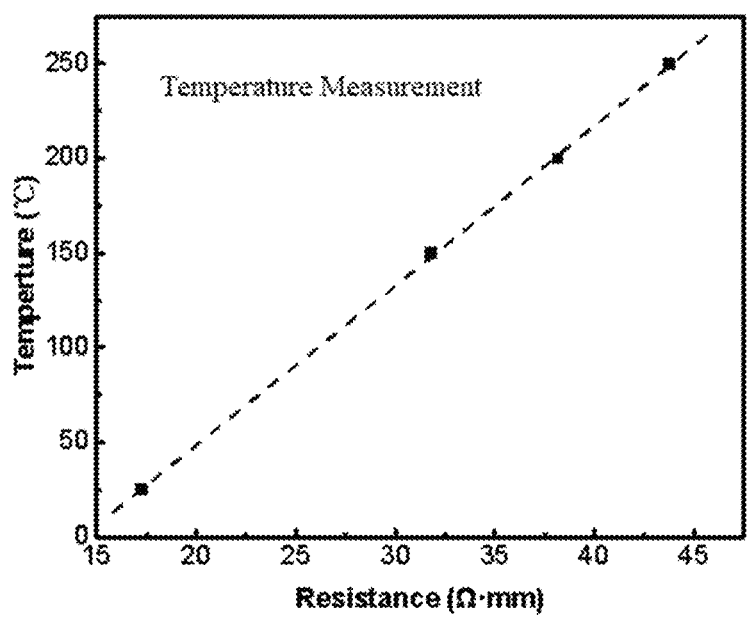
FIG. 9 is the experimental verification result diagram for temperature measurement of the relationship between partial resistance and temperature by the high-temperature three-dimensional Hall sensor with the real-time working temperature monitoring function provided by the application of the present invention.

FIG. 8 and FIG. 9 show temperature measurement of the relationship among current, voltage, resistance, and temperature by the sensor designed by the application of the present invention. As can be seen from FIG. 8, as temperature increases, the current decreases approximately linearly at the small bias voltage; as can be seen from FIG. 9, as the temperature increases, the resistance increases approximately linearly. In combination with the results of FIG. 8 and FIG. 9, it can be confirmed that the Hall sensor obtained based on the example of the present invention can perform temperature measurement while accurately measuring the magnetic field, thereby achieving real-time working temperature monitoring.

The application of the present invention provides the composite Hall sensor integrating the vertical Hall sensor on the SiC back surface and the horizontal Hall sensor on the GaN heterojunction-based front surface, which is the three-dimensional Hall sensor which is suitable for the high-temperature working environment and can achieve real-time temperature monitoring. Both GaN and SiC are wide band gap materials, and the lattice mismatch and thermal mismatch of the two materials are small. The GaN heterojunction is epitaxially grown on the SiC substrate, thereby achieving high epitaxial quality and high device reliability. More importantly, the Hall sensor that fully works in the high-temperature environment can be prepared from the composite structure thereof, that is, the vertical Hall sensor is manufactured by using the back surface-polished SiC substrate, and the horizontal Hall sensor is manufactured by using the GaN heterojunction epitaxially grown on the front surface. The size of the device is greatly reduced, and the spatial resolution of magnetic field detection is high. In addition, the temperature measurement function is added on the basis of the original Hall sensor structure, so that temperature measurement can be performed while the magnetic field is accurately measured, thereby achieving real-time working temperature monitoring.

The above are only preferred specific implementations of the present invention, but the scope of protection of the present invention is not limited thereto. Any person skilled in the art can perform equivalent substitutions or changes according to the technical solution and inventive concept of the present invention within the technical scope disclosed in the present invention, which shall all fall within the scope of protection of the present invention. The technical solution of the present invention is the important technical supplement to manufacturing of the existing magnetic sensitive sensor. The examples described in the present invention do not limit the content of the present invention, and other devices achieving the double-sided three-dimensional magnetic field detection function on the same epitaxial structure are all applicable to the scope of the solution of the present invention. Any other epitaxial structure combinations, stack structures, growth of passivation layer (including different growth techniques and different passivation layer combinations, or omitting the passivation process step directly), ohmic contact electrode fabrication processes (including different metal choices, deposition methods, and annealing conditions), or mesa etching processes are all applicable to the scope of the solution of the present invention based on the purpose of achieving the basic functions of the present invention. The substrate material may be SiC or diamond or other high-temperature resistant materials, and the epitaxial structure may also contain other materials or material combinations that achieve generate high carrier mobility.

The invention claimed is:

1. A high-temperature three-dimensional Hall sensor with a real-time working temperature monitoring function, comprising:
a substrate, a buffer layer, an epitaxial layer, and a barrier layer, wherein the buffer layer, the epitaxial layer, and the barrier layer are sequentially grown on the substrate, and there is a high-density two-dimensional electron gas induced by polarization charges in a potential well at an interface of heterojunctions of the epitaxial layer;
a lower surface of the substrate is provided with a vertical Hall sensor for sensing a magnetic field parallel to a surface of a device, and an upper surface of the barrier layer is provided with a "cross" horizontal Hall sensor for sensing a magnetic field perpendicular to the surface of the device; the vertical Hall sensor is in a shape of a "cross" as a whole, a common terminal electrode (C2), a sensing electrode (S2), a signal input terminal (C0), a sensing electrode (S1), and a common terminal electrode (C1) are sequentially arranged in a transverse direction of the "cross", a common terminal electrode (C1'), a sensing electrode (S1'), the signal input terminal (C0), a sensing electrode (S2'), and a common terminal electrode (C2') are sequentially arranged in a longitudinal direction of the "cross", and a junction of the transverse and longitudinal directions of the "cross" is the signal input terminal (C0);
four ends of the "cross" of the "cross" horizontal Hall sensor are respectively provided with a signal input electrode (C3), a signal input electrode (C4), a sensing electrode (S3), and a sensing electrode (S4), the signal input electrode (C3) is arranged opposite to the signal input electrode (C4), the sensing electrode (S3) is arranged opposite to the sensing electrode (S4); and
the signal input electrode (C3) and the signal input electrode (C4) extend from the barrier layer to the epitaxial layer and are in contact with the epitaxial layer.

2. The high-temperature three-dimensional Hall sensor with the real-time working temperature monitoring function according to claim 1, wherein the substrate is SiC, the buffer layer is any one of AlN, GaN, and a superlattice structure, the epitaxial layer is GaN, and the barrier layer is AlGaN, AlN, InAlN or any combination thereof.

3. The high-temperature three-dimensional Hall sensor with the real-time working temperature monitoring function according to claim 1, wherein the buffer layer has a thickness of 10 nm to 100 nm, the epitaxial layer has a thickness of 0.1 μm to 50 μm, and the barrier layer has a thickness of 3 nm to 100 nm.

4. The high-temperature three-dimensional Hall sensor with the real-time working temperature monitoring function according to claim 1, wherein the common terminal electrode (C2), the sensing electrode (S2), the signal input terminal (C0), the sensing electrode (S1), the common terminal electrode (C1), the common terminal electrode (C1'), the sensing electrode (S1'), the sensing electrode (S2'), the common terminal electrode (C2'), the signal input electrode (C3), the signal input electrode (C4), the sensing electrode (S3), and the sensing electrode (S4) are rectangular, trapezoidal, or circular.

5. The high-temperature three-dimensional Hall sensor with the real-time working temperature monitoring function according to claim 1, wherein the common terminal electrode (C1) and the common terminal electrode (C2) are centrally symmetric with respect to the signal input terminal (C0), and the sensing electrode (S1) and the sensing electrode (S2) are centrally symmetric with respect to the signal input terminal (C0).

6. The high-temperature three-dimensional Hall sensor with the real-time working temperature monitoring function according to claim 1, wherein a cross section of an edge of the substrate is a step, and the common terminal electrode (C1) and the common terminal electrode (C2) extend from the lower surface of the substrate to the step.

7. The high-temperature three-dimensional Hall sensor with the real-time working temperature monitoring function according to claim 1, wherein in the sensing electrode (S3), a mesa etching depth is 50 nm to 800 nm.

* * * * *